United States Patent [19]
Shiga

[11] Patent Number: 5,448,236
[45] Date of Patent: Sep. 5, 1995

[54] N-KEY ROLLOVER CIRCUIT

[75] Inventor: Sadakazu Shiga, Iwaki, Japan

[73] Assignee: Alps Electric Co., Ltd., Tokyo, Japan

[21] Appl. No.: 347,777

[22] Filed: Nov. 30, 1994

Related U.S. Application Data

[63] Continuation of Ser. No. 988,425, Dec. 9, 1992.

[30] Foreign Application Priority Data

Dec. 25, 1991 [JP] Japan .................. 3-343205

[51] Int. Cl.[6] .......................... H03M 11/20
[52] U.S. Cl. ......................... 341/25; 341/26
[58] Field of Search ............... 341/22, 24, 25, 26

[56] References Cited

U.S. PATENT DOCUMENTS

| | | | |
|---|---|---|---|
| 4,633,228 | 12/1986 | Larson | 341/26 |
| 4,709,228 | 11/1987 | Hucking et al. | 340/365 |
| 4,772,874 | 9/1988 | Hasegawa | 341/26 |
| 4,994,634 | 2/1991 | Tanji et al. | 200/5 |
| 5,057,836 | 10/1991 | Inaba | 341/22 |
| 5,081,453 | 1/1992 | Endoh et al. | 341/22 |
| 5,189,417 | 2/1993 | Caldwell et al. | 341/26 |

*Primary Examiner*—James J. Groody
*Assistant Examiner*—Glenton B. Burgess
*Attorney, Agent, or Firm*—Guy W. Shoup; Patrick T. Bever

[57] ABSTRACT

An N-key rollover circuit including a matrix of crossing drive and output lines, switch elements connected between the drive and output lines, series resistors connected to the switch elements and current detectors connected to the output lines. A grounded current detection resistor is connected to an input terminal of each current detector, each current detection resistor having a resistance value which is smaller than the resistance value of the series resistors such that most of the drive transmitted through a selected switch element onto an output line passes through the current detection resistor, even if more than one switch element is selected.

7 Claims, 4 Drawing Sheets

$$RN \left( = \frac{R1B \cdot R1C \cdots R1N}{R1B \cdot R1C + \cdots + R1N \cdot R1B} \right)$$

N-KEY ROLLOVER CIRCUIT

This application is a continuation of application Ser. No. 07/988,425, filed Dec. 9,1992.

BACKGROUND OF THE INVENTION

1. Field Of The Invention

This invention relates to a matrix switch device which has output lines extending along the row dimension and drive lines extending along the columnar dimension and in which a number of switch elements are arranged via the output and drive lines and, in particular, to an N-key rollover circuit in a matrix switch or the like which prevents "phantom key input" as a result of simultaneous depression of several keys.

2. Description Of The Related Art

A key board switch device is known in which, as in a membrane switch, a number of switch elements are arranged along the row and columnar dimensions and in which characters, figures, and other symbols are input by depressing the keys connected to the relevant switch elements.

FIG. 3 is a partial schematic diagram illustrating the circuit of a keyboard switch of this type. The drawing shows only two rows and two columns of the matrix switch device. Numerals 1 and 2 indicate output lines. Symbols A and B indicate drive lines. Numerals 1A, 1B, 2A and 2B indicate switch elements, and numerals $O_1$ and $O_2$ indicate output terminals (outputs 1 and 2).

Referring to the drawing, the switch elements 1A, 1B, 2A and 2B are turned ON by depressing keys associated therewith (not shown). Assuming that the drive line A has been selected by applying a scanning pulse SP thereto, turning ON the switch element 1A results in the formation of a closed circuit: drive line A→switch element 1A→output line 1→output terminal $O_1$, and a current $I_1$ flows to the output terminal $O_1$, with the result that a signal ("1" output) indicating the ON state of the switch element 1A is obtained at the output 1. At this time, no current flows to the other output terminals than the output terminal $O_1$, so that the other output terminals indicate the OFF ("O") state.

In this construction, if, when the drive line A has been selected, other switch elements, 1B and 2B, are turned ON, in addition to the switch element 1A as a result of simultaneous depression of several keys, another closed circuit is formed: drive line A→switch element 1A→output line 1→switch element 1B→drive line B→switch element 2B→output line 2→output terminal $O_2$, in addition to the above-mentioned closed circuit: drive line A→switch element 1A→output line 1→output terminal $O_1$, and a current $I_2$ flows to the output terminal $O_2$, with the result that a signal indicating that the switch element 2A is ON is obtained at the output 2, though that is not the case.

That is, in this case, the outputs 1 and 2 are both made "1". In other words, the output 2, which ought to be "0", is made "1", resulting in a so-called "phantom key" state, which leads to malfunction.

A conventional N-key rollover circuit which overcomes the above problem will now be described with reference to FIG. 4. In the drawing, numerals 3 and 4 indicate comparators; numeral 5, a grounding means; numerals 6 and 7, changeover switches; symbol Vref, a threshold voltage source for the comparators 3 and 4; and symbol GND, the ground potential. The components corresponding to those of FIG. 3 are indicated by the same reference numerals.

Referring to FIG. 4, resistors R1A, RIB, R2A and R2B are connected in series to the switch elements 1A, 1B, 2A and 2B, respectively, which switch elements are provided at the crosspoints of the output lines 1 and 2 and the drive lines A and B which constitute the rows and columns of the matrix. These series resistors have the same resistance value.

The grounding means 5 is composed of changeover switches 6 and 7 for reducing the potential of the drive lines other than the drive line to which the scanning pulse SP is applied (the drive line A in the drawing), that is, the potential of the drive line B (shown in this case), to the ground potential GND.

Assuming that the drive line A is selected by applying the scanning pulse SP, and that only the switch element 1A is turned ON, the current $I_1$ flows through the route: drive line A→switch element 1A→series resistor R1A→output terminal $O_1$, and the voltage level thereof is compared with the threshold value $V_{ref}$ by the comparator 3, whereby the output 1 is recognized as ON ("1").

If, simultaneously with turning ON the switch element 1A, the switch element 1B in the same row (the output line 1) is also turned ON, the current $I_2$ flows, in addition to the above current $I_1$, through the route: drive line A→switch element 1A→series resistor R1A→output line 1→series resistor R1B→switch element 1B→drive line B→ground, since the drive line B has been grounded by the changeover switch 7 of the grounding means. Accordingly, the signal level of the output 1 is reduced through division of the crest value Vin of the scanning pulse SP by the series resistors R1A and RIB.

Thus, even if, when the drive line A has been selected by applying the scanning pulse SP, switch elements other than the switch element 1A, connected to the output line 1, are erroneously turned ON, though only the switch element 1A connected to the output line 1 ought to have been turned ON, the comparator 3 can detect the voltage at the output line 1.

Further, as shown in FIG. 4, if the switch element 2B is also turned ON, no voltage is generated in the output line 2 since the drive line B is grounded, so that the output 2 of the output terminal $O_2$ is not "1". Thus, it is possible to prevent erroneous recognition due to simultaneous depression of several keys.

The threshold value $V_{ref}$ set in the comparators 3 and 4 is set to the minimum level of the same output line at the time of simultaneous key depression of the maximum number of columns.

In the N-key rollover circuit shown in FIG. 4, the output of the comparator is "1" only when the voltage level of the output line is higher than the threshold value $V_{ref}$. As described above, this threshold value $V_{ref}$ should be set lower than the voltage level of the same output line at the time of simultaneous key depression of the maximum number of columns. However, setting this value too low is undesirable since that would restrict the number of switch elements (the number of key switches) in the same output line.

As regards the output line 1 of FIG. 4, the circuit configuration thereof is as shown in FIG. 5(a), and the equivalent circuit thereof is as shown in FIG. 5(b). Here, apart from the switch element 1A, N switch elements 1B, 1C, . . . , 1N are connected to the output line 1. Thus, series resistors R1A, RiB, R1C, . . . , R1N, are connected in series to these switch elements 1A through 1N, respectively.

Assuming that all the switch elements 1B through 1N are ON, the series resistors R1B through R1N are in a relationship of parallel connection. Assuming that the combined resistance value of them is RN, the equivalent circuit of FIG. 5(a) is as shown in FIG. 5(b), and the voltage $v_1$ generated in the combined resistance RN is compared with the threshold value $V_{ref}$ by the comparator 3.

Suppose the number of switch elements connected to one output line is N; R1A=R1B= ... =R1N=10 kΩ; and $V_{ref}$=0.5 V. If, in this condition, the switch elements 1B, 1C, ..., 1N are all ON, and the switch element 1A is turned ON to supply a scanning pulse SP of +5 V to the drive line, the combined resistance RN of the series resistors R1A, RB, ..., R1N at this time is 10/NkΩ, so that the voltage $V_1$ supplied to the comparator 3 is: $5 \times RN/(RN+R1A)=5/(1+N)$. When the threshold value $V_{ref}$ is set, for example, to 0.5 V, the condition which makes the voltage $V_1$ equal to or larger than 0.5 V is as follows:

$$0.5 < 5/(1+N) \text{ Therefore, } N < 9$$

That is, when the number of switch elements connected to one output line exceeds 9, the comparator 3 will make an erroneous judgment if ten or more switch elements are simultaneously turned ON.

Thus, the number of key switches used is limited. This might be avoided by further reducing the threshold value $V_{ref}$. However, reducing the value to a level below 0.5 V will make it impossible to discriminate the value from noises or the like.

Further, there is a tendency to reduce the voltage of the scanning pulse SP (operating voltage) to approximately 3 V in order to attain a reduction in power consumption, etc. This again limits the number of key switches.

In addition, there is a dispersion in the resistance values of the series resistors R1A, ..., and the switch elements 1A, .... Thus, to augment the number of key switches, a resistance printing of high precision is required, with the result that the key switches become expensive.

SUMMARY OF THE INVENTION

It is an object of this invention to provide an N-key rollover circuit which solves the above problems, which requires no key switches to be formed by high-precision resistance printing, and which is capable of mitigating the restriction on the number of key switches used.

To achieve the above object in accordance with this invention, the switch elements connected to the output lines are provided with series resistors, and current detection resistors are provided between the output lines and the ground terminal. Further, current detectors are provided which detect a very small voltage generated in the current detection resistors and any current in the output lines, making the resistance value of the current detection resistors sufficiently smaller than the resistance value of the series resistors.

Since the resistance value of the current detection resistors is sufficiently smaller than the resistance value of the series resistors of the switch elements, any current flowing through an output line is determined substantially by the resistance value of the relevant current detection resistor and the resistance value of the series resistor of the switch element bridging between the output line and the drive line to which the scanning pulse is applied, even if the switch elements connected to the output line are all turned ON. Accordingly, whenever a current flows through an output line, it is securely detected by the current detector, thus preventing erroneous judgment.

DETAILED DESCRIPTION OF THE PREFERRED EMBODIMENT

An embodiment of this invention will now be described with reference to the drawings.

Figure 1:
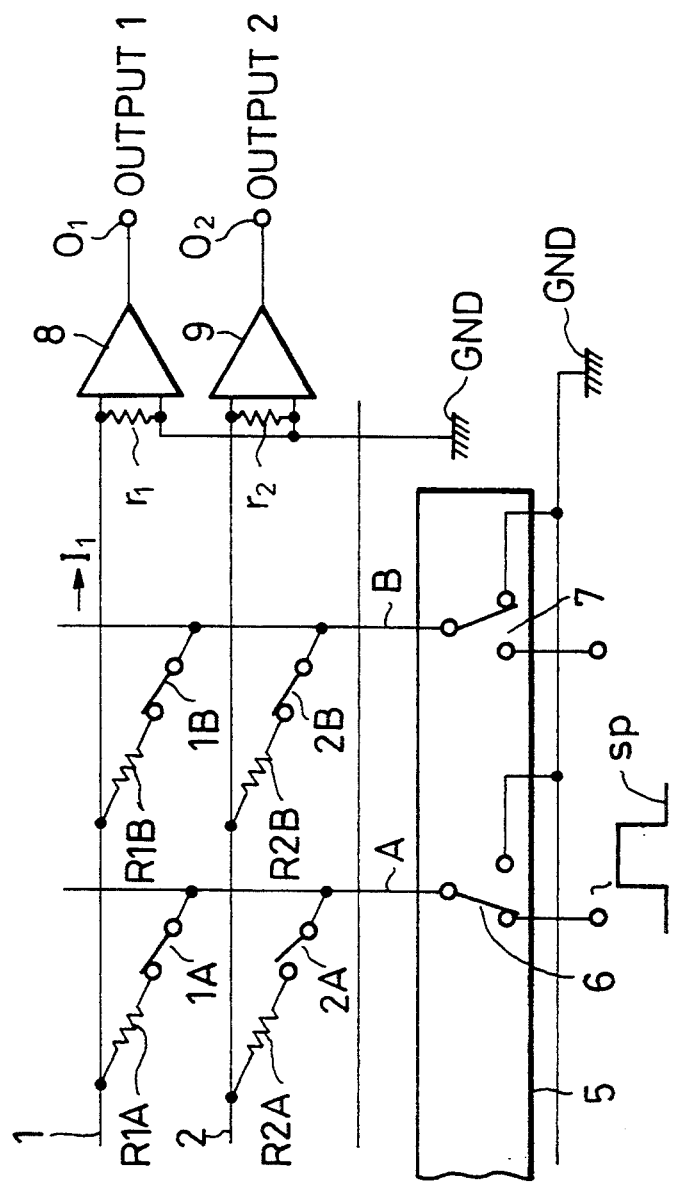
FIG. 1 is a schematic diagram showing the construction of an N-key rollover circuit according to an embodiment of this invention.
Figure 4:
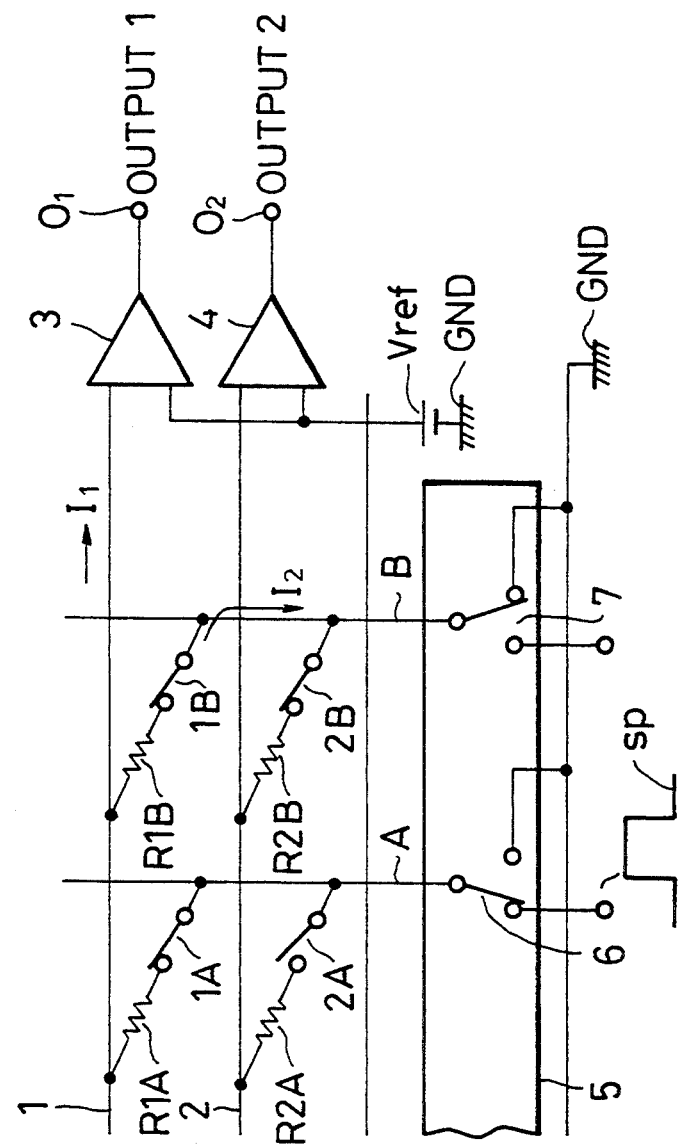
FIG. 4 is a schematic diagram showing the construction of another conventional N-key rollover circuit.
Figure 5A:
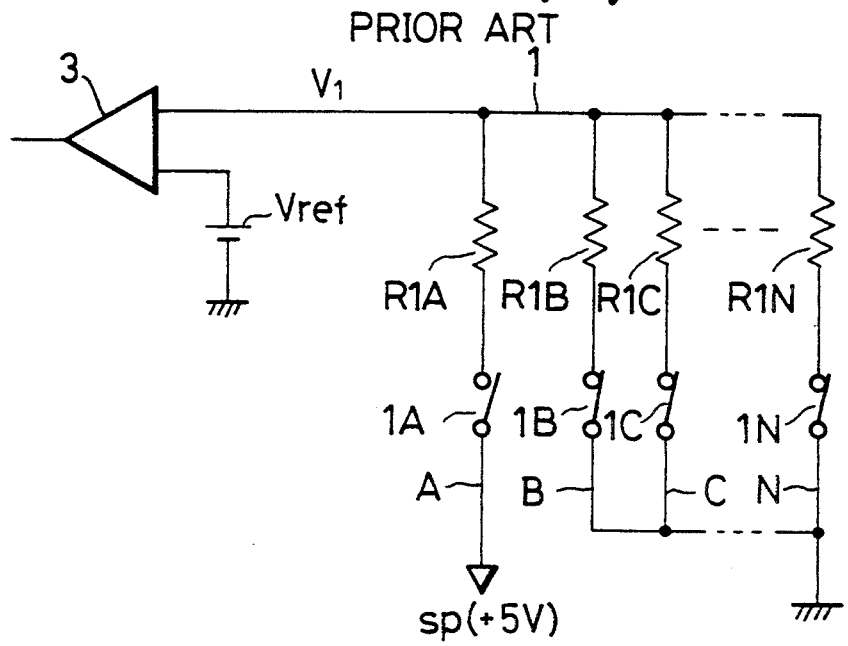
FIGS. 5(a) and 5(b) are diagrams is a diagram showing the operation of the conventional example shown in FIG. 4.
Figure 5B:
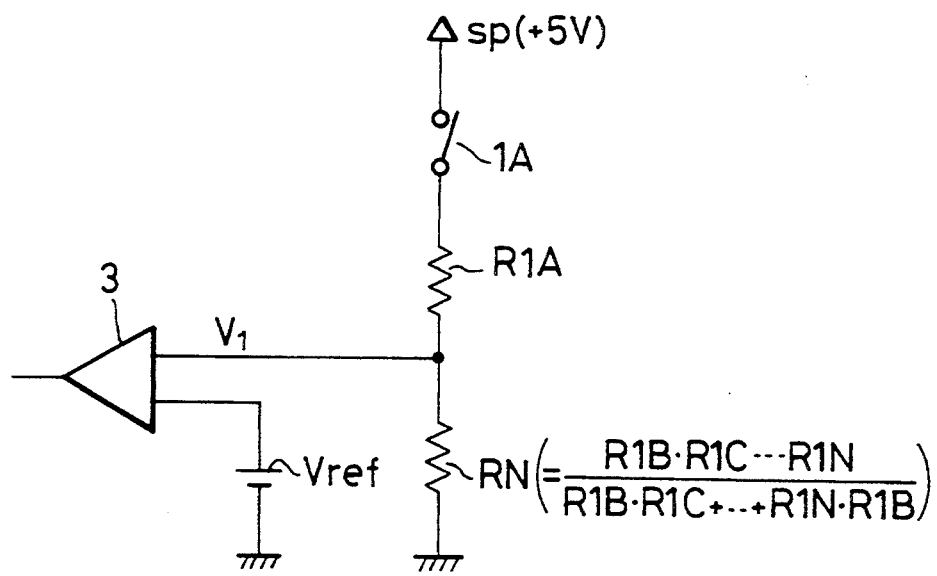

FIG. 1 partially shows the construction of an N-key rollover circuit according to an embodiment of this invention. Numerals 8 and 9 indicate current detectors, and numerals $r_1$ and $r_2$ indicate current detection resistors. The components corresponding to those of FIG. 4 are indicated by the same reference numerals, and a description thereof will be omitted.

Referring to FIG. 1, the output lines 1 and 2 are respectively connected to one input terminal of each of the current detectors 8 and 9. Further, the current detection resistors $r_1$ and $r_2$ are respectively connected between the two input terminals of each of the current detection detectors 8 and 9. The resistance value of these current detection resistors $r_1$ and $r_2$ is sufficiently smaller than the resistance value of the series resistors R1A, R1B, R2A and R2B. Apart from this, this N-key rollover circuit has the same construction as that shown in FIG. 4.

Next, the operation of this embodiment will be described.

Assuming that the switch element 1A is turned ON and the scanning pulse SP is supplied to the drive line A, the changeover switch 6 is turned ON and the changeover switch 7 is closed on the grounding side, so that the current $I_1$ flows through the route: drive line A→switch element 1A →series resistor R1A→output line 1→current detection resistor $r_1$, and a positive voltage is generated at the current detection resistor $f_1$. The current detector 8 compares this positive voltage with the ground potential to detect the flow of the current $I_1$ through the output line 1, causing the signal level of the output 1 to be "1". At this time, the drive line B is grounded so that, as in the case of the N-key rollover circuit shown in FIG. 4, the voltage of the output line 2 is not changed even when the switch elements 1B and 2B are closed, and no current flows through the current detection resistor $r_2$. Thus, the signal level of the output 2 from the current detector 9 is "0".

Thus, the output "1" cannot be obtained in the other output lines than the one connected, via the switch element in the ON state, to the drive line to which the scanning pulse SP is supplied.

Figure 2:
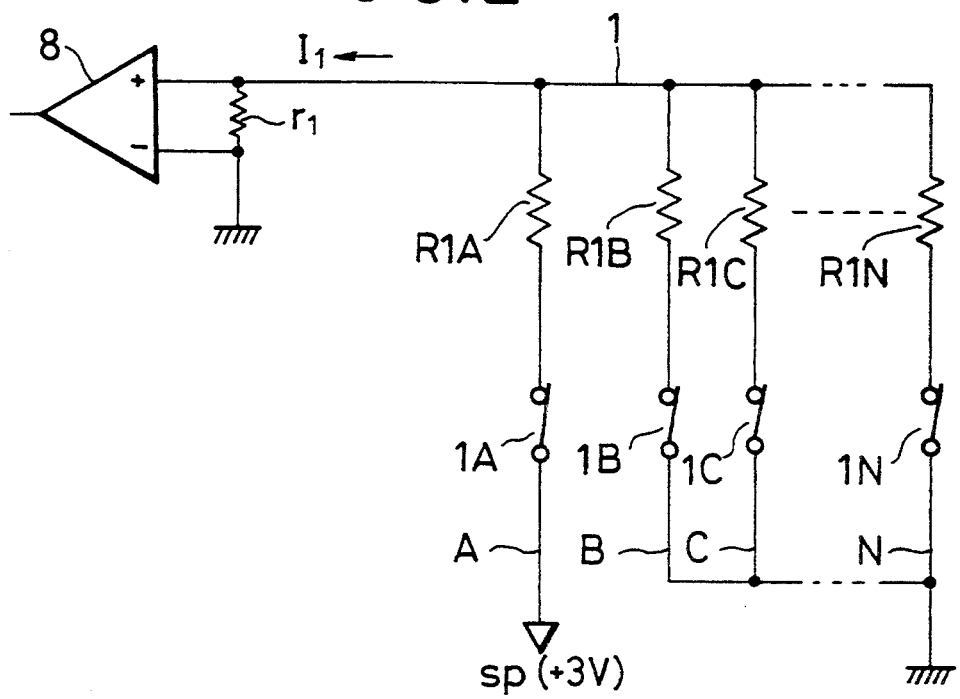
FIG. 2 is a diagram showing the operation of the embodiment shown in FIG. 1.
Figure 3:
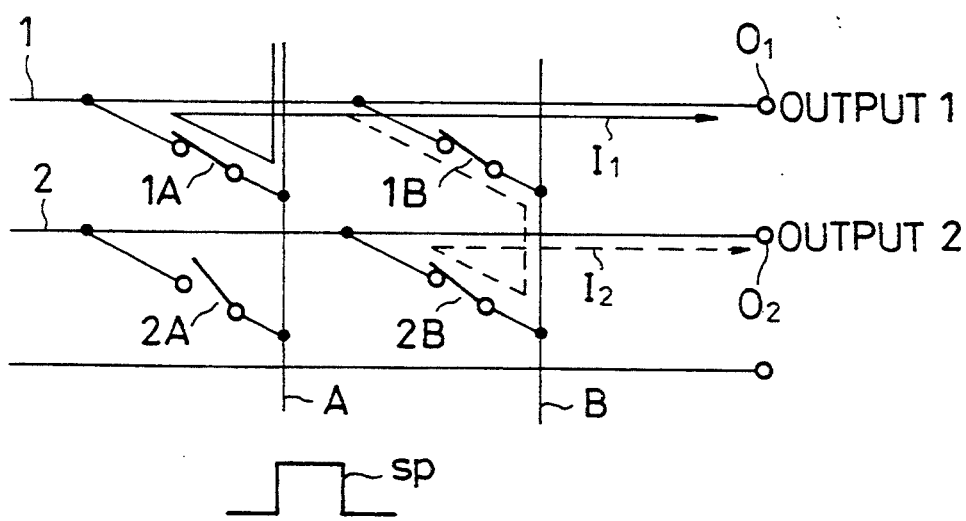
FIG. 3 is a schematic diagram showing the construction of a conventional N-key rollover circuit.

Further, even when the other switch elements connected to the output line 1 than the switch element 1A, i.e., the switch element 1B, ..., are closed, the current detector 8 securely provides the output "1" whenever the switch element 1A is closed and the scanning pulse SP is supplied to the drive line A. In the following, this phenomenon will be explained with reference to FIG. 2.

Suppose the switch element 1A is turned ON and the scanning pulse SP is supplied to the drive line A, with the N switch elements, 1B, 1C, ..., 1N being in the ON state. At this time, the current detection resistor $r_1$ and the series resistors R1B, R1C, ..., R1N are all in a relationship of parallel connection. However, since the resistance value of the current detection resistor r1 is sufficiently smaller than the resistance value of the series resistors R1B, R1C, ..., R1N (Here, it is assumed, for example, that the resistance value of the series resistors R1A, R1B, R1C, ..., R1N is 10 kΩ, whereas the resistance value of the current detection resistor $r_1$ is 100Ω), the current flows to the resistor $r_1$, which has a relatively small resistance value, and the influence of the series resistors R1B, R1C, ..., R1N of the switch elements 1B, 1C, ..., 1N on the current $I_1$ can be ignored.

Accordingly, the current $I_1$ flowing through the output line 1 is determined by the resistance value of the series resistor R1A and the resistance value of the current detection resistor $r_1$, and has substantially nothing to do with the series resistors R1B, R1C, ..., R1N. As a result, a constant reduction in voltage is generated in the current detection resistor $r_1$, thereby enabling the current detector 8 to detect the flow of the current $I_1$ through the output line 1.

Thus, in this embodiment, the ON/OFF state of irrelevant switch elements has substantially no influence on the detection of current in the output lines by the current detectors, so that the restriction on the number of key switches per output line is mitigated. Further, even if there is a dispersion in the resistance values of the series resistors of the switch elements, no malfunction is caused thereby, so that no high-precision resistance printing is required, thereby avoiding an increase in the cost of the key switches. Further, no malfunction is caused by reducing the operating voltage.

As described above, in accordance with this invention, the number of key switches used is not restricted; the operation is not influenced by any dispersion in resistance values; and inexpensive key switches can be used. Further, the operating voltage can be reduced, thereby contributing to power saving.

What is claimed is:

1. A keyboard switch device comprising:
   a plurality of switch elements respectively connected between one of a plurality of output lines and one of a plurality of drive lines arranged in a matrix-like fashion;
   signal supply means for generating a drive signal;
   a plurality of series resistors, each series resistor having a first resistance value and being connected in series with one of the plurality of switch elements;
   a plurality of current detectors, each current detector having a first input terminal connected to one of said output lines and a second input terminal;
   a plurality of current detection resistors, each current detection resistor including a first terminal connected to the first input terminal of one of said plurality current detectors and a second terminal connected to the second input terminal of said one of said plurality of current detectors, the second terminal being maintained at a fixed potential, each current detection resistor having a second resistance value which is substantially smaller than said first resistance value such that most of a current conducted by one of the output lines travels through an associated current detection resistor; and
   switching means for selectively connecting one of the plurality of drive lines to said signal supply means.

2. A device according to claim 1, wherein the second terminal of each of said current detection resistors is grounded.

3. A device according to claim 1, wherein a ratio of the first resistance value of said series resistors to the second resistance value of said current detection resistors is approximately 100:1.

4. An N-key rollover circuit of a keyboard device of the type which includes a plurality of output lines extending in a first direction, a plurality of drive lines extending in a second direction, a plurality of switch elements each switch element connected between one of the output lines and one of the drive lines, and keys for turning on these switch elements, said N-key rollover circuit comprising:
   a plurality of series resistors, each series resistor having a first resistance value and being connected in series with one of the switch elements;
   a plurality of current detection resistors having a second resistance value, each current detection resistor including a first terminal connected to one of said output lines, and a second terminal of said each of said current detection resistors being maintained at a fixed potential; and
   a plurality of current detectors having first and second input terminals, each current detection resistor being connected between the first and second input terminals of one of said current detectors such that a voltage measured by the current detector across the connected current detection resistor is determined by a current in said connected one of said output lines,
   wherein the second resistance value of said current detection resistors is substantially smaller than the first resistance value of said series resistors, thereby preventing phantom key input as a result of simultaneous depression of several keys.

5. A device according to claim 4, wherein a ratio of the first resistance value of said series resistors to the second resistance value of said current detection resistors is approximately 100:1.

6. A keyboard switch device comprising:
   an output line;
   a plurality of drive lines;
   a plurality of switch elements, each switch element connected between the output line and one of the plurality of drive lines;
   a plurality of series resistors, each series resistor having a first resistance value and being connected in series with one of the plurality of switch elements;
   a comparator having a first input terminal connected to the output line and a second input terminal connected to ground;
   a current detection resistor having a second resistance value and being connected between said first and second input terminals of the comparator such that a voltage across the current detection resistor is determined by the current in the output line;

wherein the second resistance value is substantially smaller than said first resistance value.

7. A device according to claim 6, wherein a ratio of the first resistance value of said series resistors to the second resistance value of said current detection resistors is approximately 100:1.

* * * * *